United States Patent [19]

Lantsman

[11] Patent Number: 5,584,972
[45] Date of Patent: Dec. 17, 1996

[54] PLASMA NOISE AND ARCING SUPPRESSOR APPARATUS AND METHOD FOR SPUTTER DEPOSITION

[75] Inventor: Alexander D. Lantsman, Middletown, N.Y.

[73] Assignees: Sony Corporation, Tokyo, Japan; Materials Research Corp., Orangeburg, N.Y.

[21] Appl. No.: 382,384

[22] Filed: Feb. 1, 1995

[51] Int. Cl.$^6$ ............................................. C23C 14/34
[52] U.S. Cl. ........................... 204/192.12; 204/298.08
[58] Field of Search ..................... 204/192.12, 192.13, 204/298.03, 298.07, 298.08

[56] References Cited

U.S. PATENT DOCUMENTS

| | | | |
|---|---|---|---|
| 5,126,032 | 6/1992 | Szczyrbowski et al. | 204/298.08 |
| 5,241,152 | 8/1993 | Anderson et al. | 204/298.08 |
| 5,286,360 | 2/1994 | Szczyrbowski et al. | 204/298.08 |
| 5,427,669 | 6/1995 | Drummond | 204/298.08 |

FOREIGN PATENT DOCUMENTS

| | | | |
|---|---|---|---|
| 229160 | 10/1985 | Germany | 204/298.08 |
| 42307791 | 3/1994 | Germany. | |
| 2045553 | 10/1980 | United Kingdom | 204/298.08 |
| WO94/16458 | 7/1994 | WIPO. | |

OTHER PUBLICATIONS

Muramatsu Fumio et al., "Power Source Unit of Spattering Device" Patent Abstracts of Japan, Publication No. JP61153711, Dec. 7, 1986; vol. 10, No. 354 /p–521.

"The Electrical Engineering Handbook", Richard Dorf 1993 CRC Press, Inc. pp. 132–138.

"Encyclopedia of Electroncis", Stan Gibilisco 1985 Tab Books Inc. p. 686.

*Primary Examiner*—R. Bruce Breneman
*Assistant Examiner*—Rodney G. McDonald
*Attorney, Agent, or Firm*—Wood, Herron & Evans, P.L.L.

[57] ABSTRACT

A plasma noise and arcing suppressor apparatus and method includes a suppressor circuit electrically coupled between a DC power supply and a sputter target inside of a deposition chamber. The suppressor circuit includes an inductive element electrically connected in parallel with a rectifying element. An anode of the rectifying element is coupled to the negative output terminal of the DC power supply such that during a random fluctuation in sputtering current level at the output of the power supply, attributable to random electrical noise and arcing conditions in the sputtering plasma inside the chamber, the rectifying element is negatively biased and is generally non-conductive and the inductive element stores current energy from the sputtering current level fluctuation. Subsequently, the rectifying element is momentarily positively biased and current flows in a current loop through the inductive element and rectifying element to dissipate the stored energy in the suppressor circuit and thereby reduce the amount of energy from the random fluctuation which is conducted through the plasma to thereby reduce the noise and arcing within the plasma. A limiting resistor may be placed in series with the rectifying element to limit the current flowing through the rectifying element and to further dissipate the stored energy in the suppressor circuit.

16 Claims, 2 Drawing Sheets

PLASMA NOISE AND ARCING SUPPRESSOR APPARATUS AND METHOD FOR SPUTTER DEPOSITION

FIELD OF THE INVENTION

The present invention relates generally to sputtering techniques and specifically to the suppression of detrimental plasma noise and arcing during sputter deposition.

BACKGROUND OF THE INVENTION

Sputter deposition is used extensively within the semiconductor industry to deposit thin metallic and non-metallic films or layers onto a semiconductor substrate. Cathode sputter deposition, in particular, is widely utilized and involves the use of a target of sputtering material which is to be deposited onto the surface of a substrate. The target is supported in a vacuum sputter deposition chamber in a position generally facing the surface of the substrate to be sputter coated with a layer of the target material. A negative potential is then applied to the target through a cathode support to produce an electric field proximate the target which causes electrons to be emitted from the target surface toward a remote anode such as the vacuum chamber. The emitted electrons ionize a sparse inert gas introduced within the chamber and positive gas ions are formed creating a plasma of high ion concentration. The positive ions are attracted to the negative target and the ions bombard the surface of the target, ejecting or sputtering small particles of the target material from the target. The particles of sputtering material emitted from the target surface strike and adhere to the surface of the substrate positioned opposite the target and thereby form a sputter film or layer.

The electrically disturbed nature of the ionized plasma produces an inherent amount of random plasma electrical noise. Accompanying the plasma noise is an inherent amount of electrical plasma arcing which occurs when the characteristic impedance of the plasma suddenly drops. When random arcing occurs within the plasma, the level of the sputtering current increases and detrimental amounts of electrical energy are randomly conducted through the plasma. The plasma arcing may occur in the plasma, between the plasma and the metal housing of the deposition chamber, between the target and the plasma or between the substrate and the plasma if the substrate is biased. Plasma arcing is caused by a variety of different factors. For example, arcing might be caused by flaking of the target during sputtering, overheating of the target, a gas disturbance within the plasma, or impurities in either the inert gas utilized to form the plasma or the target material. Inherently, plasma noise produces a certain amount of micro-arcing within plasma inside the deposition chamber. However, the micro-arcing may develop into more severe plasma arcing within the chamber.

Plasma noise, micro-arcing and severe arcing all adversely affect the quality of the sputter deposition coating. For example, the noise and arcing contributes to the deterioration of the film properties during deposition and may lead to substrate contamination and device damage on the substrate. Therefore, plasma noise and arcing reduces the yield of the sputter deposition process and reduces the overall productivity of sputtering equipment.

The source of plasma electrical instability in DC sputtering is a result of the plasma discharge and its interaction with the DC power supply which is utilized to originate the plasma. Therefore, the drawbacks of plasma noise and plasma arcing are inherent in DC sputter deposition regardless of the use of a metallic or non-metallic target or the use of a reactive gas for reactive sputter deposition. Noise and arcing problems also exist regardless of whether the substrate is electrically biased, or whether the target is biased with an additional RF source. Currently available commercial plasma DC power supplies utilized for sputter deposition do not adequately address the effects of plasma noise and arcing. Available power supplies only have the capabilities to detect the most severe arcing within the chamber, e.g., a stable DC current in excess of approximately 50–110 A. Such power supply detection circuits are not designed for plasma noise and micro-arcing but are utilized mainly for protecting the power supply during a detectable electrical short at the output. Upon detecting such a short or a continuous, severe arc, the power supply momentarily interrupts the output (i.e. 4–25 msec.) to eliminate the short or arc. The response time for conventional power supply detection circuits is generally in the range of 100–500 μsec. However, plasma noise and plasma micro-arcs generally have a much shorter duration, and thus currently available plasma DC power supplies to not have the ability to respond to plasma noise/arcing current fluctuations having a frequency in the order of 1–10 MHz (i.e. a duration of 0.1–1.0 μsec). As a result, currently available plasma DC power supplies are inadequate for controlling plasma noise and micro-arcing when utilized for sputter deposition and thus cannot reduce the resultant detrimental effects on the sputter deposited film.

Furthermore, currently available power supplies may actually exacerbate the problems associated with plasma arcing. For example, a DC power supply has a certain amount of electrical energy stored therein which is predominantly in the output stage of the power supply, such as in the output filter. Upon the existence of micro-arcing or arcing conditions, the stored energy may be discharged into the sputtering chamber. The discharged energy pulse has a duration of approximately 0.2–2 μsec., which is too rapid to be controlled or limited by the detection circuitry of the power supply. The related in-rush currents of the discharged energy are in the order of 50–250 A and may adversely contribute to the development of arcing conditions within the plasma because the stored energy is essentially poured into or conducted through the fluctuating plasma. Therefore, currently-available plasma DC power supplies may actually contribute to the development of detrimental arcing conditions in addition to the existing plasma noise and micro-arcing.

Accordingly, it is an object of the present invention to reduce plasma noise and micro-arcing during DC sputter deposition to improve the electrical stability of the plasma and to thus yield improved sputter deposition of thin films. It is a further objective to reduce the contamination of the deposited films and the damage to the devices on a substrate due to plasma noise/arcing. It is a further objective of the present invention to control severe arcing conditions and to improve operation of the internal detection circuits of a DC power supply to reduce the detrimental effects of plasma arcing. It is a still further objective of the present invention to reduce plasma noise and arcing simply, inexpensively and efficiently without affecting the processing conditions and the biasing conditions of the cathode target.

SUMMARY OF THE INVENTION

The apparatus and method of the present invention improve the sputter deposition of a material layer onto a substrate by improving the electrical stability of the sputtering plasma and sputter deposition system. Generally, a suppressor circuit is placed in-line between the DC plasma power supply and a sputtering target cathode to suppress the amount of random energy which is conducted through the plasma due to sputtering current fluctuations from plasma noise and plasma arcing.

More specifically, the suppressor circuit comprises an inductive element such as an inductor coil, which is electrically connected in parallel with a rectifying element, such as a diode. The anode of the diode is electrically coupled to the negative output terminal of the power supply while the cathode of the diode is coupled to the target cathode. During normal operation of the power supply for sputter deposition, the diode is negatively biased and is generally non-conductive and the inductor functions electrically as a short circuit. However, during a random fluctuation in the level of sputtering current at the power supply output, such as an increase in the sputtering current which is attributable to electrical noise and arcing conditions in the sputtering plasma, the diode remains negatively biased and generally non-conductive, but the inductor absorbs and stores sputtering current energy from the current level fluctuation. Upon cessation of the sputtering current level fluctuation, the inductor momentarily positively biases the diode such that current flows in a current loop through the inductor and diode to dissipate the stored current energy in the suppressor circuit. The dissipation of the stored electrical energy within the suppressor circuit reduces the amount of energy from the arc-induced sputtering current fluctuation which is actually conducted through the plasma. This, in turn, reduces the effects of the plasma noise and plasma arcing to yield improved sputter deposition.

Furthermore, the suppressor circuit improves the operation of the power supply during a severe arcing condition by suppressing the initial power supply discharge which normally is directed into the plasma. Further, the suppressor circuit decreases the amount of time which the power supply detection circuit requires to detect the severe arcing condition and momentarily interrupt the power supply to eliminate the arc from the plasma.

In an alternative embodiment of the present invention, a limiting resistor might be utilized in series with the diode in order to limit the forward current throughout the diode during noise/arc suppression and to further dissipate the stored energy from the inductor. Preferably, the inductor will have an inductance value in the range of 0.1–10 mH. The diode preferably has a peak repetitive reverse voltage in the range of 3–5 kV RMS and higher, a non-repetitive peak surge current in the range of 75 A and higher and an average rectified forward current in the range of 1–3 A and higher.

The suppressor circuit of the present invention reduces plasma noise and plasma micro-arcing in the sputter plasma while maintaining the pre-set sputtering voltage and sputtering current output levels of the deposition system. The reduction of plasma noise, micro-arcing and severe arcing will improve the sputter deposition and reduce contamination of the deposited films and damage to the devices on the substrate. Furthermore, the present invention suppresses the random energy delivered into the plasma inexpensively and efficiently without extensive modifications to either the DC power supply or the sputter deposition chamber or the target cathode. The above and other objectives and advantages of the present invention shall be made apparent from the accompanying drawings and the description thereof.

BRIEF DESCRIPTION OF THE DRAWING

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF SPECIFIC EMBODIMENTS

Figure 1:
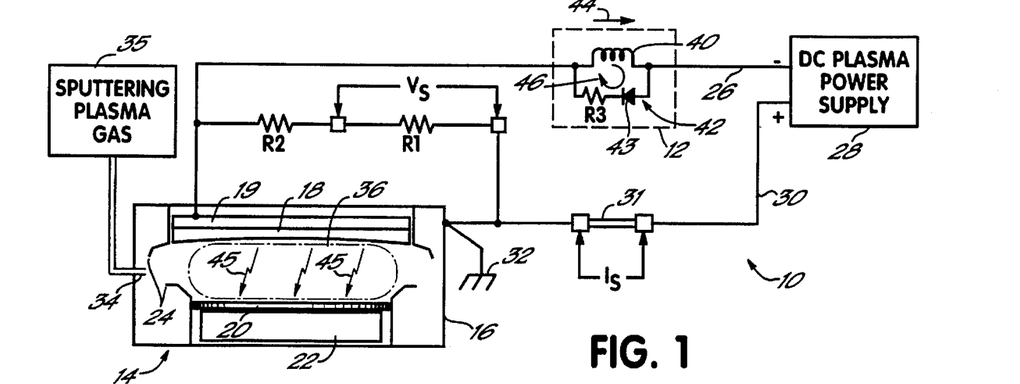
FIG. 1 is a schematic view of a sputter deposition system utilizing the plasma noise/arc suppressor circuit of the present invention.

FIG. 1 schematically illustrates a typical sputter deposition system 10 utilizing the plasma noise/arcing suppressor circuit 12 of the present invention. A vacuum sputter deposition chamber 14 includes a sealed metal housing 16 and a target 18 of sputter material supported within the housing 16 by a conductive target support 19. Positioned inside the chamber housing 16, generally opposite target 18, is a substrate or wafer 20 which is to be coated with a layer or film of sputtered target material. Substrate 20 is supported on a backplane or wafer chuck 22 directly below target 18. Shields 24 surround both the target 18 and substrate 20 and may be utilized to contain the sputter plasma therebetween for efficient sputtering.

During sputter deposition, the support 19 acts as a system cathode and therefore, support 19 is connected to the negative output terminal 26 of a plasma DC power supply 28. The metal housing 16 of chamber 14 is connected to the positive output terminal 30 of power supply 28 and is also connected to earth ground 32 to act as the anode of the system.

During sputter deposition, an inert plasma gas is introduced between target 18 and substrate 20 by a gas introduction port such as port 34 which is connected to a sputtering gas supply 35. The target cathode 19 and grounded housing 16 create an electric field within the sputtering chamber housing 16 proximate target 18. Electrons (not shown) are ejected from target 18 and interact with the inert plasma gas to create an ionized plasma 36 proximate the target 18. Positive ions (not shown) from the plasma 36 are attracted to the target cathode 19 and bombard the target 18 to dislodge or sputter target particles therefrom. Target particles are then deposited upon substrate 20 where they form a sputter deposited film.

FIG. 1 illustrates a simple DC cathode sputter deposition system 10, however, the plasma noise/arcing suppressor circuit 12 of the present invention might be utilized with other more elaborate sputtering equipment. For example, sputter chamber 14 might utilize a magnetron device (not shown) for focusing and concentrating the plasma. Furthermore, reactive gas might be introduced between the target 18 and the substrate 20 in order to create reactive sputter deposition. Still further, substrate 20 might be biased with a DC or RF source in order to enhance the deposition process. The substrate backplane 22 might include an elaborate heating mechanism utilizing backside gas to heat substrate 20. Furthermore, the backplane may rotate for a more uniform sputter deposition onto substrate 20. Therefore, while the suppressor circuit 12 of the present invention is described herein with respect to simple cathode sputter deposition the suppressor circuit 12 is not limited to such a technique and may be utilized with other more DC elaborate sputter deposition techniques.

The output of power supply 28 comprises positive terminal 26 and negative terminal 30 and provides a power output including sputtering voltage and sputtering current to the system 10. The sputtering voltage, designated $V_S$, may be measured across a voltage divider comprising resistors R1 and R2 connected across the terminals of power supply 28 and between target cathode 19 and housing 16. The sputter current, $I_S$, may be measured by a current shunt 31 connected in-line to the positive terminal of the power supply 28 as illustrated in FIG. 1.

The plasma noise/arcing suppressor circuit 12 of the present invention is coupled between the negative terminal 26 of power supply 28 and the target cathode 19 and comprises an inductive element, such as an inductive coil or inductor 40, connected electrically in parallel with a rectifying element, such as a diode 42. An anode 43 of the diode 42 is connected to the negative terminal 26 of power supply 28. A resistor R3 may be optionally connected in series with diode 42 for optimization of the noise/arcing suppressor circuit 12 as described further hereinbelow.

The random existence of noise and arcing in the plasma 36, designated in FIG. 1 by reference numeral 45, causes the level of the sputtering current to fluctuate and to randomly increase and decrease in the case of noise, and to increase in the case of an arc or micro-arc. That is, the power supply 28 provides fluctuating sputtering current into plasma 36. The current level fluctuation will be random, because the noise and micro-arcs are random. The higher sputtering current level during a micro-arc or arc delivers a greater amount of energy to the plasma resulting in an electrically unstable plasma. The noise, arcs and unstable plasma are detrimental to sputter deposition. Generally, inherent plasma noise will develop into a micro-arc, which left uncontrolled will develop into a more severe arc. The frequency of the noise and micro-arcs which occur in deposition chamber 14 is too high to be properly handled by the internal detection circuitry of power supply 28 which has a very slow response time and is mainly utilized for protection of the power supply 28 during shorting or severe arcing of a long duration.

In accordance with the principles of the present invention, inductor 40 absorbs the energy of the random sputtering current fluctuations which are caused by plasma noise and micro-arcing 45 and dissipates the energy through the suppressor circuit. That is, the inductor 40 absorbs the energy from a sputtering current increase associated with the duration of the noise pulse or micro-arcing pulse 45, and subsequently dissipates the absorbed energy during the downside of the pulse or sputtering current level decrease. Therefore, the increased energy produced by plasma noise and micro-arcing is not realized in the plasma 36 within the sputtering chamber 14.

More specifically, during normal operation of the sputter deposition system 10, power supply 28 provides energy to plasma 36 by means of sputtering current $I_S$ and sputtering voltage $V_S$. The suppressor circuit 12 is connected in-line between the negative terminal 26 of supply 28 and the target cathode 19. As already noted, the anode 43 of the diode 42 is connected to negative terminal 26. During sputter deposition, the inductor reaches steady state and thus will generally function as a short circuit within the electrical system of sputter deposition system 10, such that the sputtering current is directed in the direction of arrow 44. Diode 42 is negatively or reverse biased and thus will generally not conduct a significant portion of sputter current Is.

However, when a random fluctuation of the sputtering current level occurs, i.e. an increase in sputtering current Is due to plasma noise/micro-arcing, the inductor 40 is no long in steady state and the inductor 40 begins to store the increased current energy. The storage of the increased current energy in inductor generally reduces the amount of current energy which is delivered to plasma 36 during noise and micro-arcing 45. Plasma noise and micro-arcing generally have a very short duration, and thus, the current level fluctuations are short lived. Upon cessation of the sputtering current level increase, such that during the downside of a noise pulse or a momentary sputtering current decrease, the polarity across the inductor 40 is momentarily reversed such that the diode 42 is positively or forward biased. The diode 42 thereby momentarily conducts and current flows in the loop of the suppressor circuit 12 containing inductor 40 and diode 42 as indicated by arrow 46. The momentary current flow dissipates the stored current energy in the inductor 40 and diode 42 and thus reduces the amount of energy from the random current fluctuation which is sent through the plasma. Noise or micro-arcing current pulses are generally short in duration, and thus, the amount of stored energy to be dissipated in the suppressor circuit 12 will not be very high, and thus the power capacity of the suppressor circuit 12 will not have to be very high.

The optional limit resistor R3 may be placed in series with diode 42 to limit the peak current within the suppressor circuit loop during dissipation of the stored energy. Resistor R3 further dissipates the stored energy. The value of resistor R3 should not exceed the range of one to ten percent (1–10%) of the characteristic impedance of the DC plasma which will be determined by the plasma conditions in order to prevent dissipation of the stored energy into the plasma 36. Typically, the DC plasma impedance is in the range of 10 to 150 Ohms.

The suppressor circuit 12 of the invention thereby improves sputter deposition 14 by suppressing random sputtering current fluctuations due to plasma noise, micro-arcing, and severe arcing. Suppressor circuit 12 reduces the development of micro-arcing from inherent plasma noise and further reduces the development of more severe arcing from micro-arcing. In addition, during severe arcing, the suppressor 12 enhances the operation of the internal detection circuitry of the plasma DC power supply 28 as will be described in greater detail hereinbelow. Depending upon the specific process conditions of the sputter deposition, suppressor circuit 12 should be optimized by optimizing various parameters of the inductor coil 40 and diode 42. For example, the target material, the power supply output level, the gas delivery rate/pressure range, the amount of stored energy in the DC power supply, as well as other various and often unmeasurable arcing parameters, will effect the electrical stability of plasma 36 and thus will affect the operation of suppressor circuit 12. Data for the suppressor circuit design and the optimization of the suppressor circuit may be derived from measurements taken during sputter deposition. For example, the wire gauge of the inductor coil would be chosen with reference to the level of DC sputtering current that the inductor would conduct. The inductance value of inductor 40 would be chosen to achieve a specific level of plasma noise suppression. For example, the impedance of an inductor and the amount of current level suppression is directly proportional to the inductance value. Further, the wire insulation rating of the inductor coil and the Peak Repetitive Reverse Voltage ($V_{PRR}$) rating of diode 42 should be chosen so that the suppressor circuit 12 is able to withstand the fluctuating voltage across coil 40 induced by plasma noise/arcing. Similarly, the Non-Repetitive Peak Surge Current ($I_{NRPS}$) and the Average Rectified Forward Current ($I_{ARF}$) ratings of diode 42 should be chosen so that suppressor circuit 12 is able to withstand the current through diode 42 during dissipation of the stored energy within the suppressor circuit. Typical values for the inductance of coil 40 and typical current and voltage ratings for the operation of diode 42 are set forth hereinbelow for use with conventionally available plasma DC power supplies and sputter deposition systems.

TABLE 1

TYPICAL COIL VALUES AND DIODE PARAMETERS

| | |
|---|---|
| Coil Inductance | .1–10 MH |
| Peak Repetitive Reverse Voltage | 3–5 kV RMS and higher |
| Non-Repetitive Peak Surge Circuit | 75 A and higher |
| Average Rectified Forward Current | 1–3 A and higher |

The suppressor circuit 12 of the present invention has been constructed and tested and has produced suppression of random sputtering current/sputtering voltage noise by a factor of approximately 8–10, for example. Furthermore, the results illustrated that the suppressor circuit produces suppression of arcing at plasma ignition. FIG. 1 illustrates the measuring points for measuring sputtering voltage $V_S$ and sputtering current $I_S$ which were utilized in testing the suppressor circuit 12 of the present invention. The sputtering voltage $V_S$ is proportional to the voltage $V_{R1}$ across resistor R1 of the voltage divider comprising resistors R1 and R2. For testing purposes, R1=10 k and R2=990 k. Accordingly, $V_S = V_{R1}(R1+R2)/R1 = 100 \ V_{R1}$. Therefore, the conversion factor is approximately 100 to 1, and a one volt measurement across R1 is reflective of a hundred volt potential at the cathode target 18. The sputtering current $I_S$ is proportional to the voltage across the current shunt 31. Preferably, shunt 31 is chosen with a conversion factor of 1 mV=1A (or 100 mV=100A). The current shunt 31 is placed in the power return line connected to the positive terminal 30 of the power supply 28. The resistor value of R2 (990 k) is selected to be much greater than the value of R1 (10 k) for safety purposes. With the shunt 31 positioned as shown in FIG. 1 and the chosen resistor values, the voltage and current measuring equipment as well as the measuring personnel are not exposed to high voltages during sputter deposition and testing.

Figure 2A:
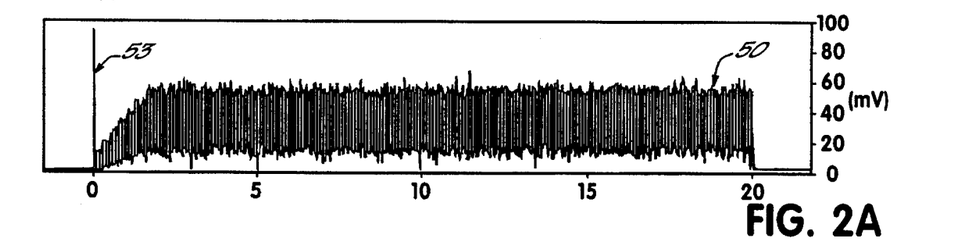
FIGS. 2A and 2B are illustrative graphs of sputtering current and sputtering voltage, respectively, for a typical sputter deposition system without the suppressor circuit of the present invention.
Figure 2B:
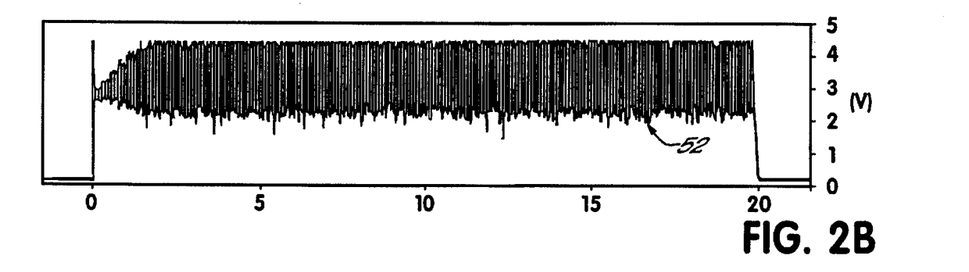
Figure 3A:
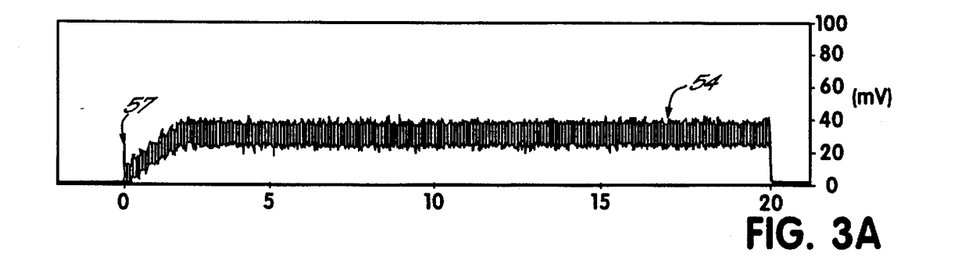
FIGS. 3A and 3B are illustrative graphs of sputtering current and sputtering voltage, respectively, of a sputter deposition system utilizing the suppressor circuit of the present invention.
Figure 3B:
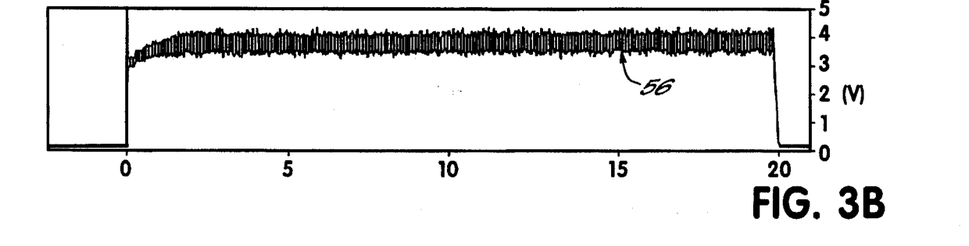
Figure 4A:
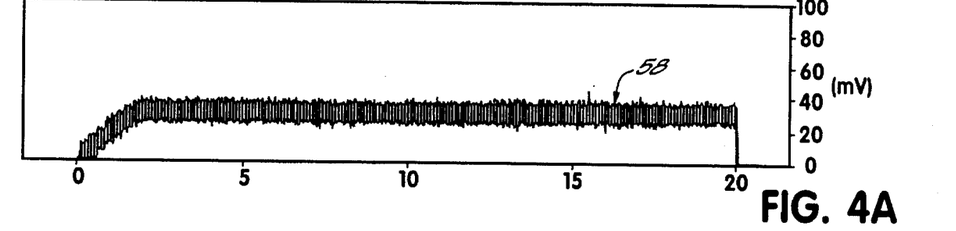
FIGS. 4A and 4B are further illustrative graphs of sputtering current and sputtering voltage, respectively, for a sputter deposition system utilizing the suppressor circuit of the invention.
Figure 4B:
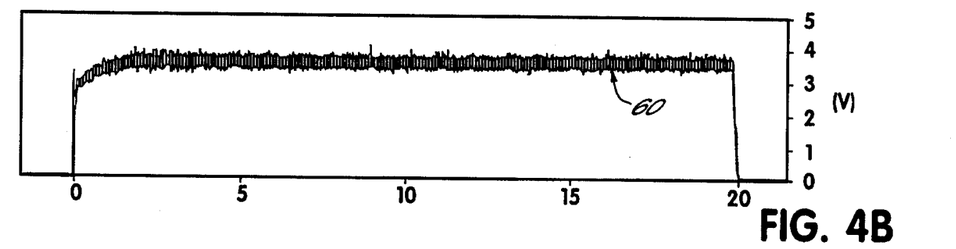

Furthermore, to enhance accuracy, resistors R1, R2 and the shunt 31 are positioned reasonably close, e.g., 3–15 feet, to the target cathode 19. In the sputter deposition system utilized to test the suppressor circuit 12 of the present invention as discussed hereinbelow, the voltage divider of R1, R2 was approximately four feet from the target cathode 19 while current shunt 31 was approximately 6 feet from the target cathode 19. The suppressor circuit 12 was placed approximately five feet from the target cathode 18. The sputtering voltage $V_S$ and sputtering current $I_S$ were measured by a chart recorder which plotted the voltages across R1 and shunt 31, respectively. The measured sputtering current and sputtering voltage for the sputter deposition process without use of the suppressor circuit 12 of the present invention are shown in FIGS. 2A and 2B, respectively. FIGS. 3A and 3B illustrate one measurement of sputtering current and the sputtering voltage, respectively, for a sputter deposition process utilizing the suppressor circuit 12 of the present invention with one inductive coil 40 having one inductance value of 0.245 mH. FIGS. 4A and 4B illustrate another measurement of sputtering current and sputtering voltage, respectively, with the suppressor circuit 12 of the invention and the coil 40 having an inductance value of 2.25 mH. As graphically illustrated by a comparison of FIGS. 2A and 2B without the suppressor and the FIGS. 3A and 3B and FIGS. 4A and 4B utilizing the suppressor circuit 12 of the present invention, it may be readily seen that suppressor circuit 12 provides a very efficient suppression of plasma noise and micro-arcing.

To test suppressor circuit 12 of the present invention, an Eclipse-Mark II sputtering chamber set at Sputter Mode 2 was utilized and is commercially available from Materials Research Corporation (MRC) of Orangeburg, New York. The cathode 19 was a rotating magnet cathode RMA-12 also available from MRC, while the target was a commercial, high sputtering quality, aluminum alloy target available from MRC. The DC plasma power supply was an MDX-30 kW supply available from Advanced Energy Industries, Inc. of Fort Collins, Co. During the various tests which were performed, the DC power level at the supply output was in the range of 6–20 kW while the processing times for the tests were in the range of 5–60 seconds. Argon gas was utilized for the sputtering plasma and the argon gas flow and pressure ranges achieved within deposition chamber 14 for the tests were are follows: 50 / 2.8; 100/4.7; 150 / 6.4 sccm / mT. The charting equipment utilized to produce the sputtering current and voltage charts of FIGS. 2A, 2B, 3A, 3B, 4A, 4B, 5A and 5B was a thermal arraycorder WR7600 available from Western Graphtec of Irvine, Calif. The recorder had a bandwidth with a range of 0.5–1 kHz.

In the sputtering current graphs, illustrated in the figures, the scale is 100 mV=100 A while in the illustrated sputtering voltage graphs, 5 V=500 V. The horizontal scale of the charts is illustrated in five second increments; however, the horizontal scale of the chart recorder was actually 0.5 seconds per chart division with a total of forty divisions for an elapsed measurement time of twenty seconds.

As illustrated in FIGS. 2A and 2B, during conventional sputter deposition, wide plasma noise bands occur for both the sputtering current 50 (FIG. 2A) and the sputtering voltage 52 (FIG. 2B). Thus without the suppressor circuit 12 of the present invention, the plasma noise will cause microarcing and quite possibly more severe arcing due to the rapid fluctuation of sputtering current. Furthermore, as illustrated in FIG. 2A, arcing occurs at plasma ignition as shown by current spike 53.

However, utilizing the suppressor circuit 12 of the present invention, the noise bands 54, 56 are drastically reduced as shown in FIGS. 3A, 3B illustrating a suppression of plasma noise and micro-arcing. The suppressor circuit values and process parameters for the measurements illustrated in FIGS. 3A, 3B are set forth below in Table 2.

TABLE 2

VALUES AND PARAMETERS FOR FIGS. 3A AND 3B

| | |
|---|---|
| DC Power | 15 kW |
| Gas Flow/Pressure | 100/4.7 sccm/mT |
| Process Time | 20 sec. |
| Backplane heat | none |
| Inductance Value of Inductive Coil | .245 mH |
| Wire gauge of Inductive Coil | 12 |
| Insulation Rating of Inductive Coil Wire | 600 V |
| Diode Parameters | |
| Peak Repetitive Reverse Voltage ($V_{PRR}$) | 3 kV RMS |
| Non-Repetitive Peak Surge Current ($I_{NRPS}$) | 100 A |
| Average Rectified Forward Current ($I_{ARF}$) | 1.6 A |
| Optional Limiting Resistor (R3) | None |

Utilizing the parameters and component values of Table 2 above, with suppressor circuit 12 of the present invention, the plasma noise of the sputtering current and the respective sputtering voltage is suppressed by a factor of approximately 8. Furthermore, as may be seen in FIG. 3A, the arcing is drastically reduced at plasma ignition as illustrated by a smaller current spike 57. The overall reduction of the plasma noise reduces plasma micro-arcing and further reduces the possibility of a micro-arc breaking down the impedance of the plasma and producing a more severe arc.

An inductive coil having a higher inductance value was utilized for the tests illustrated in FIGS. 4A and 4B. The component values and process parameters for FIGS. 4A, 4B are set forth herein below in Table 3.

TABLE 3

VALUES AND PARAMETERS FOR FIGS. 4A AND 4B

| | |
|---|---|
| DC Power | 15 kW |
| Gas Flow/Pressure | 100/4.7 sccm/mT |
| Process Time | 20 sec. |
| Backplane heat | none |
| Inductance Value of Inductive Coil | 2.25 mH |
| Wire gauge of Inductive Coil | 10 |
| Insulation Rating of Inductive Coil Wire | 600 V |
| Diode Parameters: | |
| Peak Repetitive Reverse Voltage ($V_{PRR}$) | 3 kV RMS |
| Non-Repetitive Peak Surge Current ($I_{NRPS}$) | 100 A |
| Average Rectified Forward Current ($I_{ARF}$) | 1.6 A |
| Optional Limiting Resistor (R3) | None |

With a higher inductance value coil, the plasma noise bands 58, 60 of the sputtering current and the sputtering voltage were suppressed by a factor of approximately 10 or greater. Furthermore, as illustrated in FIG. 4A, the arcing at plasma ignition which occurs in FIGS. 2A and 3A is totally eliminated. That is, any high amplitude current pulse at plasma ignition is actually no higher than the plasma noise level of the sputtering current.

Figure 5A:
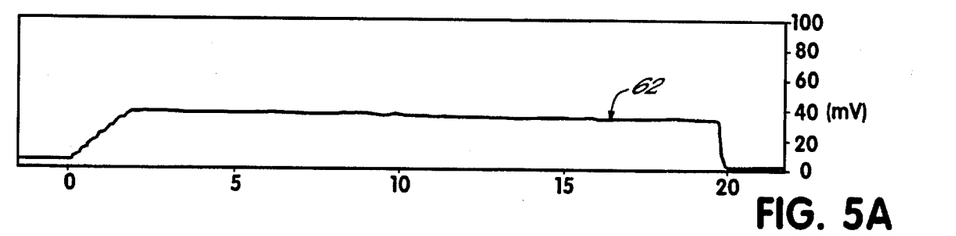
FIGS. 5A and 5B are illustrative graphs of sputtering current and sputtering voltage, respectively, used as a reference to illustrate the effect of the suppressor circuit on the power supply output level.
Figure 5B:
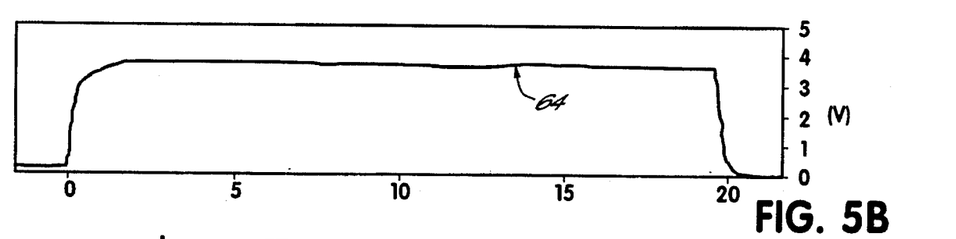

The suppressor circuit 12 of the present invention also does not dramatically affect the average sputtering current and sputtering voltage corresponding to a chosen DC power supply output level. FIGS. 5A and 5B illustrate operating levels 62, 64 for sputtering current and sputtering voltage, respectively, which were recorded after the signals were filtered with a low-pass filter having a bandwidth of approximately 10 Hz. The signals were conditioned or filtered to meet the CPU requirements of the Eclipse Sputtering System and to provide a reference point for the measurements. The signals were filtered both for the sputtering deposition system without the suppressor circuit 12 of the invention (FIGS. 2A and 2B) and for the sputter deposition system utilizing the two different suppressor circuits (FIGS. 3A, 3B and 4A, 4B). When filtered, the signals for each of the systems were identical to those illustrated in FIGS. 5A, 5B. Therefore, the test levels and the respective reference levels of FIGS. 5A, 5B clearly illustrate that the suppressor circuit 12 of the present invention does not dramatically effect the average sputtering current and average sputtering voltage which is achieved for a particular DC power supply output level. While maintaining the average sputtering current and voltage levels at the supply output, the suppressor circuit 12 improves the processing on a micro-level by reducing plasma noise and micro-arcing and preventing their development into more intensive electrical disturbances such as severe arcing.

The suppressor circuit 12 of the present invention reduces plasma noise and micro-arcing and thus improves the quality of the sputter deposited thin films. Furthermore, through a reduction of plasma noise and micro-arcing, contamination of the sputter film as well as device damage on the substrate is reduced thus producing an overall increase in the productivity of DC sputtering equipment. Additionally, the suppressor circuit 12 of the invention further enhances the operation of the internal detection circuitry of the power supply 28. When arcing occurs within plasma 36 during sputter deposition, the impedance of the plasma is lowered and the power supply output discharges stored energy into the plasma. The stored energy is predominantly in the output stage of the plasma DC power supply 28, such as stored energy from the output filter, which exists in all DC power supplies utilized for sputter deposition. The internal detection circuitry of commercially available plasma DC power supplies is only capable of detecting the most severe arcing in order to protect the power supply from shorting. The response time for the detection circuitry generally exceeds 100–500 μsec. However, the duration of discharged energy stored in the output stage of the power supply during arcing is approximately 0.2–2.0 μsec. The discharge is accompanied by in-rush currents in the range of 50–250 A. The in-rush current is not controlled or limited by the plasma DC power supply and thus it adversely contributes to the development of arcing conditions by discharging stored energy into the fluctuating and arcing plasma.

Figure 6:
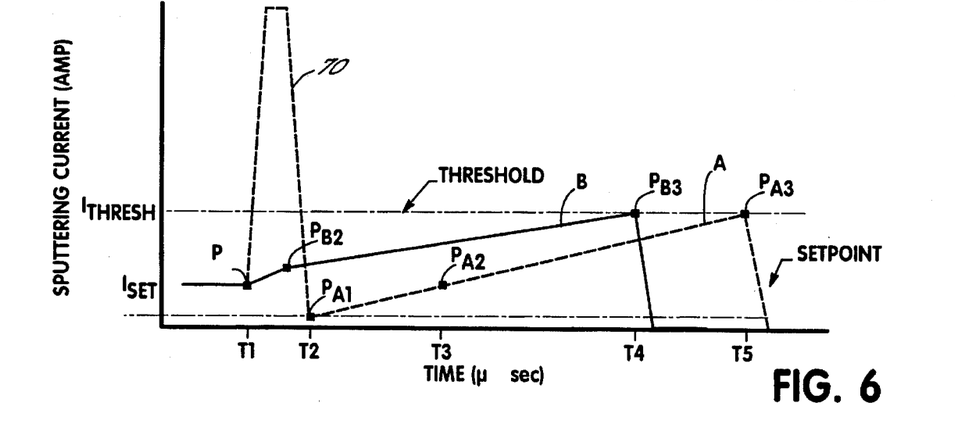
FIG. 6 is an illustrative graph of the sputtering current level during severe arcing conditions both without the suppressor circuit of the invention and with the suppressor circuit.

FIG. 6 graphically illustrates a typical sputtering current waveform for conventional sputter deposition systems during severe arcing as compared with a sputtering current waveform produced by the suppressor circuit 12 of the present invention during severe arcing. The dashed-line A illustrates the power supply output discharge during severe arcing. The horizontal and vertical axes of the graph in FIG. 6 are not labelled with specific numerical values, as such values will be determined by the process parameters of the sputter deposition as well as the operational parameters of the equipment and component values of the suppressor circuit 12. During a severe arc, an initial current pulse 70 occurs which may have an amplitude between 50 and 250 A and a duration in the range of 0.2–2.0 μsec. As mentioned, the current pulse is produced by the power supply discharging current energy into the unstable plasma. While the amplitude of the current pulse 70 exceeds the current threshold level of the internal detection circuitry of the power supply as indicated by $I_{THRESH}$, the detection circuitry does not detect the pulse 70 because of its inherently slow response time which is generally in the order of 100–500 μsec. Upon cessation of the current pulse 70, at time $T_2$, the sputtering current has dropped below the supply output level set point at $I_{SET}$ as indicated at point $P_{A1}$ on line A. Since the sputtering current has dropped below the power supply set point, the internal detection circuitry of the power supply would not begin monitoring the sputtering current level until that level returned to the set point $I_{SET}$ which occurs at approximately time $T_3$. Thereafter the sputtering current level is monitored by the power supply as it progresses from point $P_{A2}$ until it reaches the threshold level $I_{THRESH}$ at point $P_{A3}$. Line A reaches the current threshold $I_{THRESH}$ at $T_5$ which may be anywhere from 100 to 500 μsec after the initiation of the output discharge $(T_1)$ and current pulse 70. The power supply detection circuitry then detects the shorting or arcing conditions at time $T_5$ when the average sputtering current exceeds the threshold current level $I_{THRESH}$ of the circuit whereupon power supply 28 momentarily interrupts the output (e.g. 4–5 msec) to eliminate the shorting or arcing condition. However, by time $T_S$ the detrimental effects of plasma arcing may have already occurred within deposition chamber 14.

Line B in FIG. 6 illustrates the sputtering current levels when the suppressor circuit 12 of the invention is placed between the DC plasma power supply 28 and the target cathode 19. At the initiation of the power supply output circuit discharge (at $T_1$), the inductive coil 40 begins storing the energy associated with the discharge. The sputtering current level increases for the duration of the current level increase from the discharge as indicated by the slope of line B between points $P_{B1}$ and $P_{B2}$. Thus, there is no high current pulse 70 discharged into the plasma. The suppression of the pulse 70 by the suppressor circuit 12 may be sufficient to eliminate the severe arcing altogether. However, should the severe arcing condition continue beyond the duration of pulse 70, the level of the sputtering current will continue to gradually increase as indicated by the slope of line B between points $P_{B2}$ and $P_{B3}$. When the sputtering current level reaches $I_{THRESH}$, the power supply momentarily interrupts the output to clear the arcing as will occur when the system is utilized without the suppressor circuit 12 of the present invention. However, as illustrated in FIG. 6, the sputtering current level is maintained above the power supply set point $I_{SET}$ during and after the initial power supply output discharge 70. Therefore, the detection circuitry of the power supply 28 begins monitoring the excessive sputtering current at $T_1$ rather than at $T_3$ as occurs in a sputter deposition system which does not utilize the suppressor circuit 12 of the invention. Accordingly, the response time of the power supply detection circuitry is decreased as the sputtering current reaches $I_{THRESH}$ at $T_4$ as opposed to $T_5$. Therefore, in addition to reducing the probability of severe arcing by suppressing the initiating mechanism of plasma noise and micro-arcing, the suppressor circuit 12 of the present invention also improves the sputter deposition process during severe arcing by suppressing the initial high level supply output discharge 70 and further by reducing the response time of the power supply detection circuitry so that the power supply 28 interrupts itself more rapidly upon the occurrence of severe arcing conditions within the deposition chamber 14.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. A sputter deposition system for improving the electrical stability of sputtering plasma to improve the sputter deposition of a material layer onto a substrate, the system comprising:

a sputtering chamber configured for receiving a substrate and including a conductive support for supporting a target of material proximate the substrate;

a sputtering gas introduction port in said sputtering chamber for introducing a sputtering gas into the chamber proximate said target support;

a DC power supply having an output with a positive terminal and a negative terminal, the power supply operable to provide sputtering current and sputtering voltage at the output, and the target support electrically couplable to said power supply output such that an electric field may be generated proximate the target for exciting the sputtering gas to create a plasma of ionized gas particles to bombard the target and sputter said target material onto the substrate in the chamber;

a suppressor circuit electrically couplable between said power supply output and said target support, the suppressor circuit comprising an inductive element electrically connected in parallel with a rectifying element, the inductive element having a low inductance value approximately at or below 100 mH to thus reduce the inherent capacitive characteristics of the inductive element, the rectifying element being electrically couplable to the negative terminal of said power supply output such that during a random fluctuation in the level of sputtering current at the power supply output attributable to electrical noise and arcing conditions in the sputtering plasma, the rectifying element is negatively biased and is generally non-conductive and the inductive element predominantly inductively stores sputtering current energy from the current level fluctuation, and then subsequently the rectifying element is momentarily positively biased by the low inductance inductive element with reduced capacitance such that current flows in a current loop through the inductive element and rectifying element to dissipate the stored current energy in the suppressor circuit and thereby reduce the amount of energy from the random fluctuation which is conducted through the plasma;

whereby the noise and arcing within the plasma is reduced for improved sputter deposition.

2. The sputter deposition system of claim 1 wherein the inductive element is an inductive coil.

3. The sputter deposition system of claim 2 wherein the inductive coil has an inductance value in the range of approximately 0.1 to 10 mH.

4. The sputter deposition system of claim 1 wherein the rectifying element is a diode.

5. The sputter deposition system of claim 4 wherein the diode has a peak repetitive reverse voltage rating of at least 1 kV.

6. The sputter deposition system of claim 1 wherein the diode has a non-repetitive peak surge current rating of at least 75 Amperes.

7. The sputter deposition system of claim 4 wherein the diode has an average rectified forward current rating of at least 1 Ampere.

8. The sputter deposition system of claim 1 further comprising a limiting resistor connected in series with the rectifying element to limit the current flowing through said rectifying element and further dissipate the stored energy in the suppressor circuit.

9. A method of improving the electrical stability of a sputtering plasma during sputter deposition of a material layer onto a substrate comprising:

biasing a sputter target inside of a sputter deposition chamber with a DC power supply having positive and negative output terminals which deliver sputtering current and sputtering voltage;

introducing a sputtering gas into the sputtering chamber such that an electric field proximate the biased target excites the sputtering gas and creates a plasma of ionized gas particles which bombard the target to sputter material from the target onto a substrate positioned in the chamber;

coupling an inductive element in parallel with a rectifying element between said sputter target and said DC power supply, the negative output terminal connected to an anode of the rectifying element the inductive element having a low inductance value approximately at or below 100 mH to thus reduce the inherent capacitive characteristics of the inductive elements;

absorbing and predominantly inductively storing sputtering current energy with the inductive element when the rectifying element is negatively biased and generally non-conductive and the level of the sputtering current randomly fluctuates due to electrical noise and arcing conditions in the sputtering plasma; and     momentarily positively biasing the rectifying element with the low inductance inductive element having reduced capacitance and subsequently dissipating the stored current energy by flowing current in a current loop through the inductive element and the momentarily positively biased rectifying element to reduce the amount of energy from the random fluctuation which is sent through the plasma;

whereby the noise and arcing within the plasma is reduced for improved sputter deposition.

10. The method of claim 9 wherein the inductive element is an inductive coil.

11. The method of claim 10 wherein the inductive coil has an inductance value in the range of approximately 0.1 to 10 mH.

12. The method of claim 9 wherein the rectifying element is a diode.

13. The method of claim 12 wherein the diode has a peak repetitive reverse voltage rating of at least 1 kV.

14. The method of claim 12 wherein the diode has a non-repetitive peak surge current rating of at least 75 Amperes.

15. The method of claim 12 wherein the diode has an average rectified forward current rating of at least 1 Ampere.

16. The method of claim 9 further comprising coupling a limiting resistor in series with the rectifying element to limit the current flowing through said rectifying element and further dissipate the stored energy in the suppressor circuit.

\* \* \* \* \*

UNITED STATES PATENT AND TRADEMARK OFFICE
CERTIFICATE OF CORRECTION

PATENT NO. : 5,584,972
DATED : December 17, 1996
INVENTOR(S) : Alexander D. Lantsman It is certified that error appears in the above-indentified patent and that said Letters Patent is hereby corrected as shown below:

Column 6, lines 15 and 16, "Is" should be --$I_s$--.

Column 12, line 57, "of claim 1" should read --of claim 4--.

Column 13, line 20, "elements" should read --element--.

Signed and Sealed this

Ninth Day of September, 1997

*Attest:*

BRUCE LEHMAN

*Attesting Officer*   *Commissioner of Patents and Trademarks*